(12) United States Patent
Stecher et al.

(10) Patent No.: US 8,665,054 B2
(45) Date of Patent: Mar. 4, 2014

(54) SEMICONDUCTOR COMPONENT WITH CORELESS TRANSFORMER

(75) Inventors: Matthias Stecher, Munich (DE); Markus Menath, Regensburg (DE); Andreas Zankl, Wiesent (DE); Werner Robl, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/452,075

(22) Filed: Apr. 20, 2012

(65) Prior Publication Data

US 2013/0278372 A1    Oct. 24, 2013

(51) Int. Cl.
*H01F 5/00* (2006.01)
*H01L 27/08* (2006.01)

(52) U.S. Cl.
USPC ........................................... 336/200; 257/531

(58) Field of Classification Search
USPC ........... 336/199, 200, 225, 226, 232; 257/531
See application file for complete search history.

(56) References Cited

U.S. PATENT DOCUMENTS

| 5,622,635 | A   | * | 4/1997 | Cuomo et al. ................... 216/68 |
| 7,990,662 | B2  | * | 8/2011 | Berkley et al. ................... 361/19 |
| 8,427,266 | B2  | * | 4/2013 | Wu et al. ...................... 336/84 C |
| 8,436,709 | B2  | * | 5/2013 | Fouquet et al. ............... 336/200 |
| 2010/0033290 | A1 | * | 2/2010 | Liu et al. ....................... 336/200 |
| 2011/0043316 | A1 | * | 2/2011 | Yang et al. .................... 336/192 |
| 2011/0156854 | A1 | * | 6/2011 | Lee ............................... 336/200 |

* cited by examiner

*Primary Examiner* — Alexander Talpalatski
*Assistant Examiner* — Joselito Baisa
(74) *Attorney, Agent, or Firm* — Slater & Matsil, L.L.P.

(57) ABSTRACT

A semiconductor component has integrated a coreless transformer with a first connection contact, a second connection contact, an electrically conductive spiral first coil, an electrically conductive first ring, and an electrically conductive second ring. The electrically conductive spiral first coil is electrically connected between the first connection contact and the second connection contact. The electrically conductive first ring surrounds the first coil and one or both of the first connection contact and the second connection contact. The electrically conductive second ring is arranged between the first coil and the first ring, electrically connected to the first coil, and surrounds the first coil and one or both of the first connection contact and the second connection contact.

30 Claims, 5 Drawing Sheets

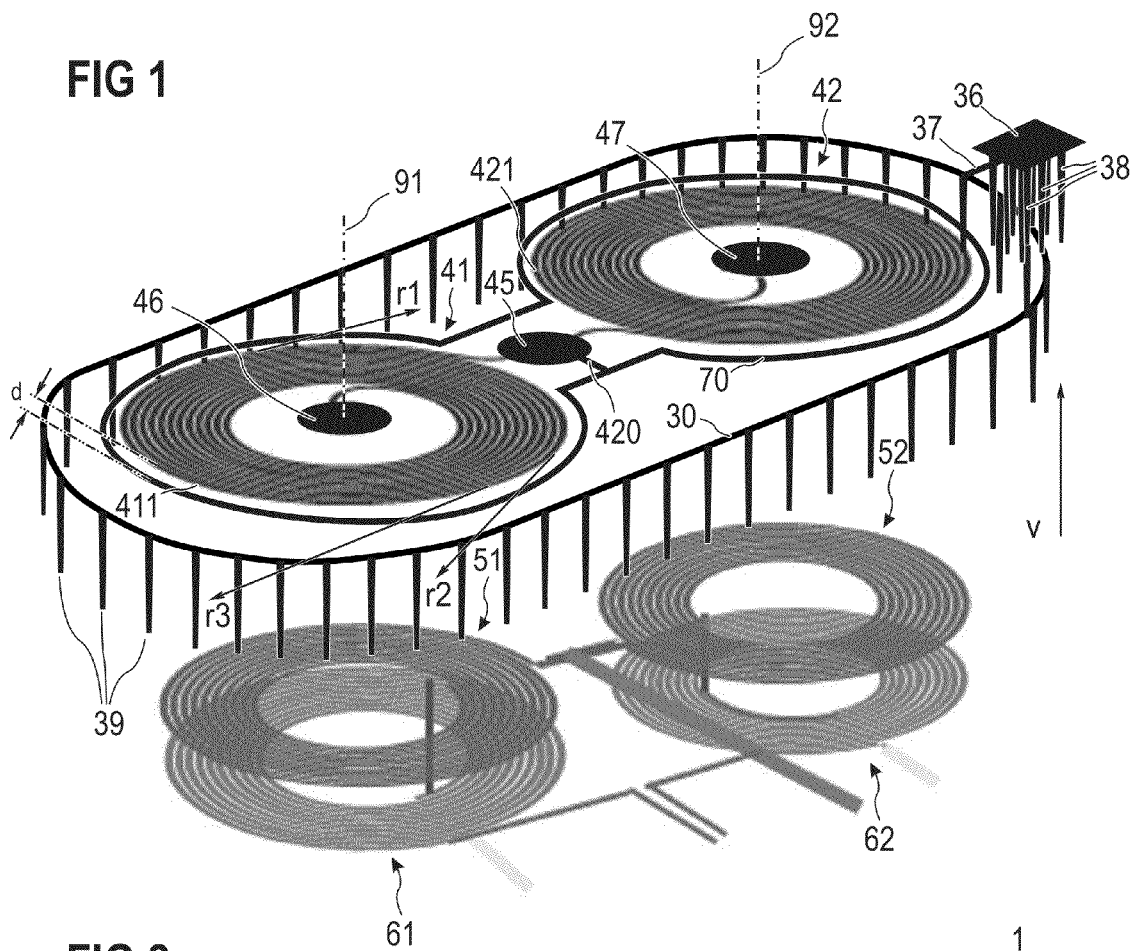
FIG 1
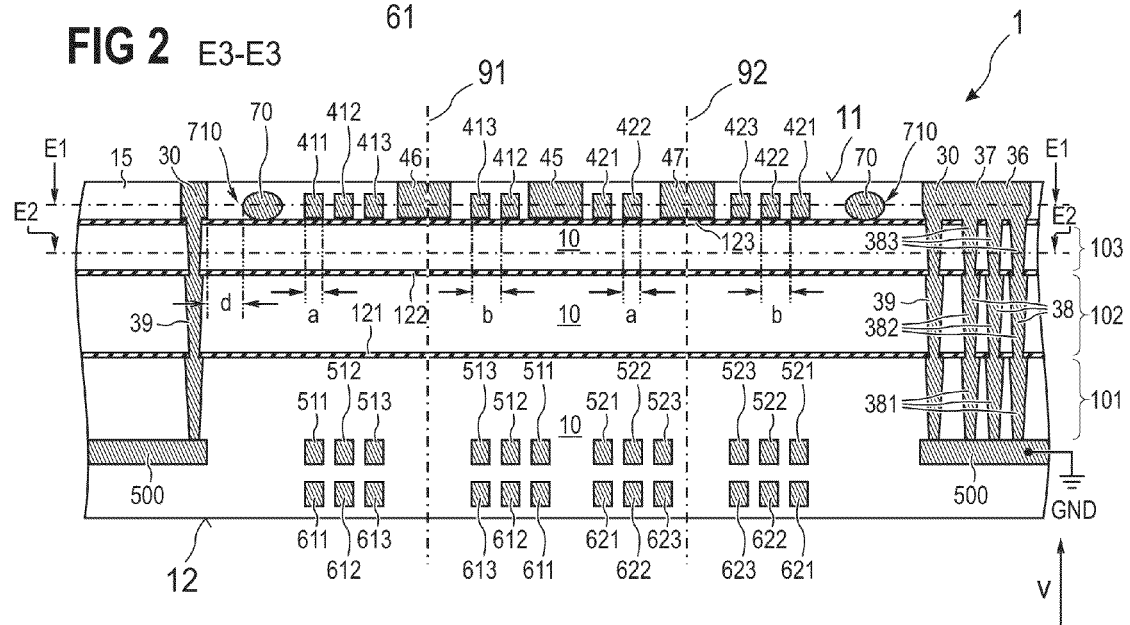
FIG 2 E3-E3

FIG 3 E1-E1
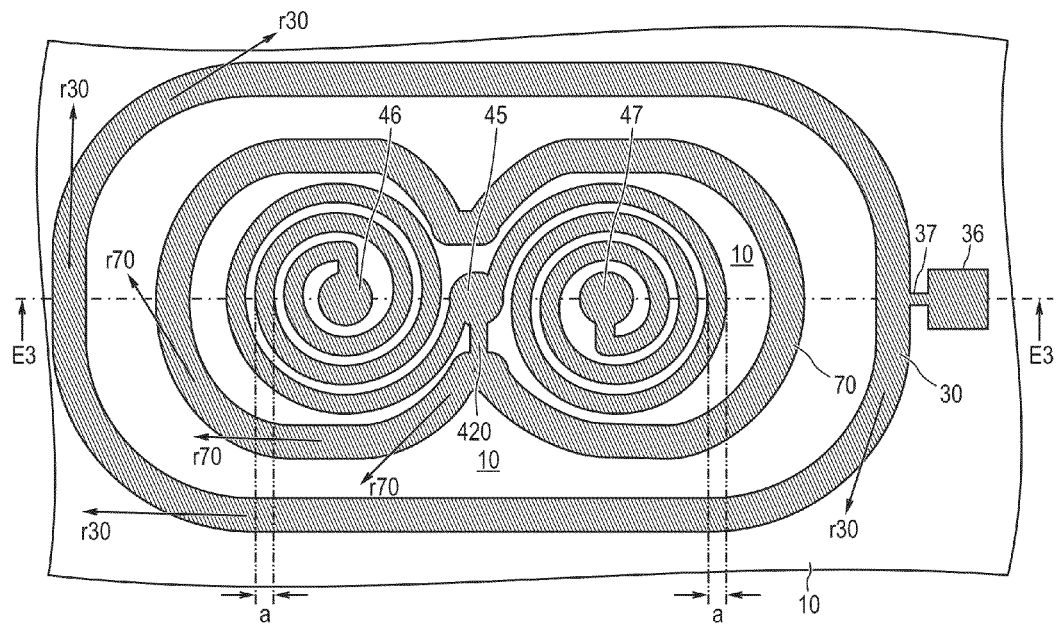
FIG 4 E2-E2
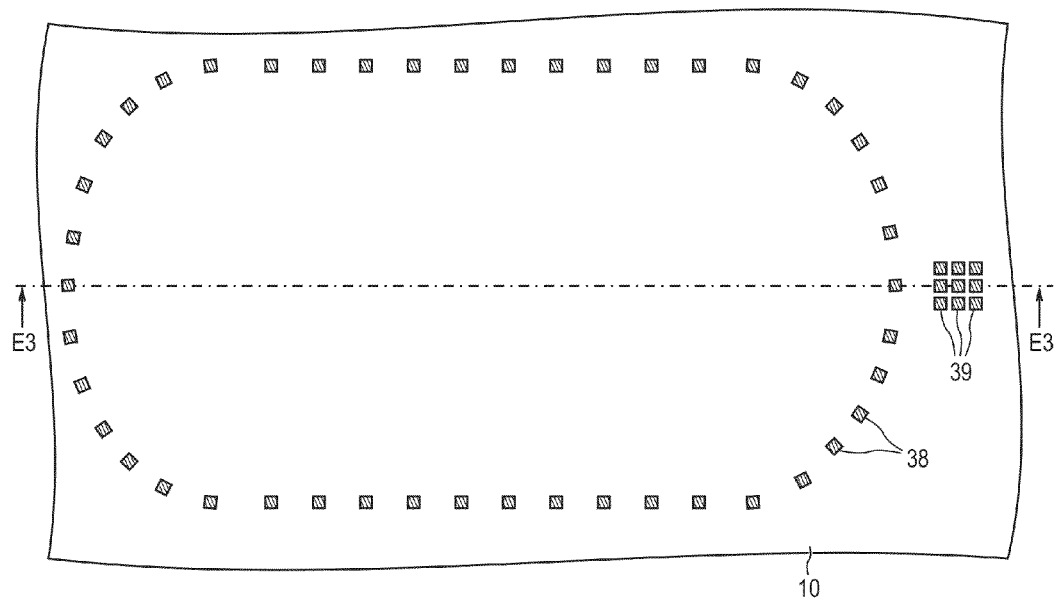

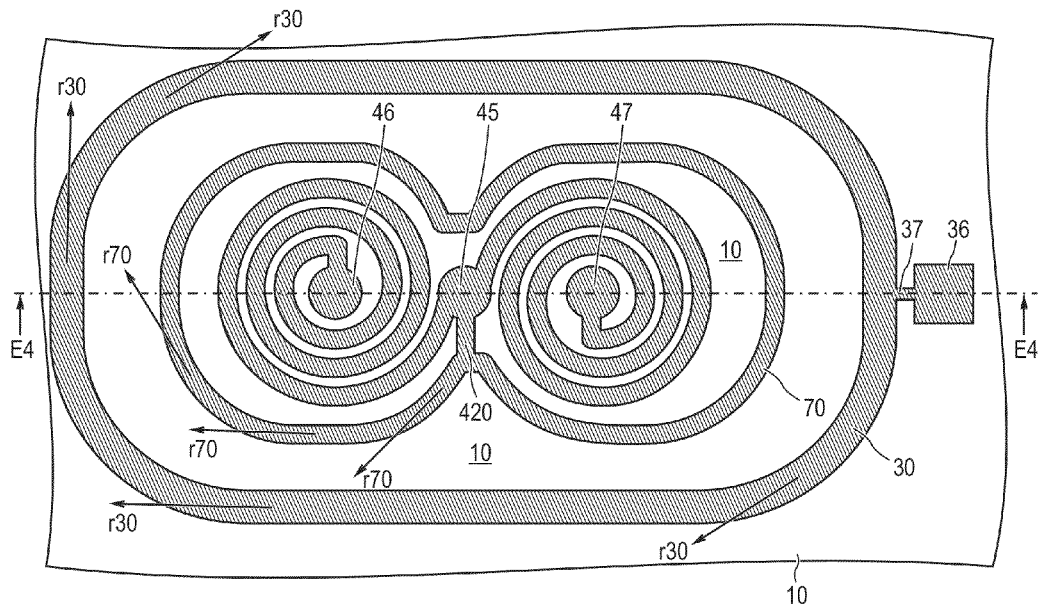
FIG 5  E5-E5
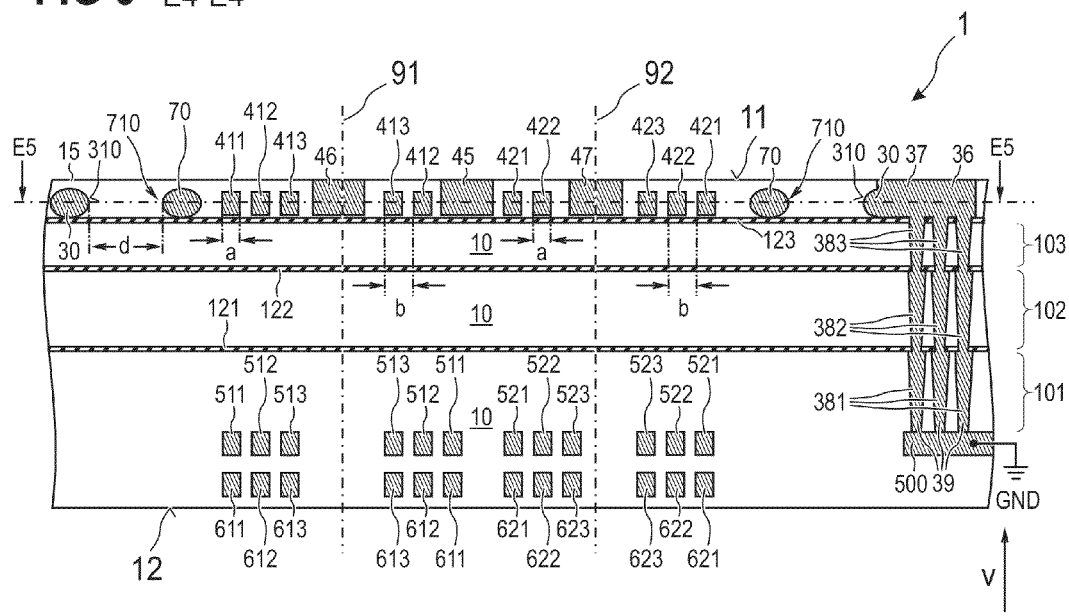
FIG 6  E4-E4

SEMICONDUCTOR COMPONENT WITH CORELESS TRANSFORMER

TECHNICAL FIELD

Embodiments of the invention relate to semiconductor components with an integrated coreless transformer.

BACKGROUND

Coreless transformers serve, in particular, to galvanically decouple different elements or sub-circuits of an electric circuit. Such a coreless transformer may be monolithically integrated in a semiconductor body. If during operation high voltages are applied to a coil of a coreless transformer, electrical breakdown may occur. The present invention provides an improved solution.

SUMMARY OF THE INVENTION

It was found that the peaks of an electric field that is caused by a high voltage to a coil of a coreless transformer can be equalized with a ring that surrounds the coil. Such a ring may be a closed ring, or an open but substantially closed ring.

According to one aspect of the present invention, a semiconductor component has an integrated coreless transformer with a first connection contact, a second connection contact, an electrically conductive spiral first coil, an electrically conductive first ring, and an electrically conductive second ring. The electrically conductive spiral first coil is electrically connected between the first connection contact and the second connection contact. The electrically conductive first ring surrounds the first coil and one or both of the first connection contact and the second connection contact.

The electrically conductive second ring is arranged between the first coil and the first ring, electrically connected to the first coil, and surrounds the first coil and one or both of the first connection contact and the second connection contact.

In order to further equalize the electric field, the surface of the second ring may be, in a cross-sectional plane that extends perpendicular to the running direction of the second ring, rounded. The respective rounding may be localized at least on that side of the second ring that faces towards a further electrically conductive structure that is operated on an electric potential which is different from the electric potential of the coil.

According to a further aspect, a coreless transformer as described above may be operated without damage even if the absolute value of the potential difference between the first ring and the first coil exceeds (1 kV/20 µm) times the distance between the first ring and the second ring. For instance, the absolute value of the potential difference may be at least, 6 kV, at least 10 kV or even at least 20 kV.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 1 is a perspective view of a coreless transformer of a semiconductor component;

FIG. 2 is a cross-sectional view of a section of the semiconductor component of FIG. 1;

FIG. 3 is a cross-sectional view of the section of the semiconductor component of FIGS. 1 and 2 in a sectional plane E1-E1 marked in FIG. 2;

FIG. 4 is a cross-sectional view of the section of the semiconductor component of FIGS. 1, 2 and 3 in a sectional plane E2-E2 marked in FIG. 2;

FIG. 5 is a cross-sectional view of a section of a semiconductor component with a coreless transformer that differs from the semiconductor component of FIGS. 1 to 4 in that the surface of the first ring is partly rounded in cross-section;

FIG. 6 is a cross-sectional view of the section of the semiconductor component of FIG. 5 in a sectional plane E4-E4 marked in FIG. 5;

DETAILED DESCRIPTION OF ILLUSTRATIVE EMBODIMENTS

Figure 7:
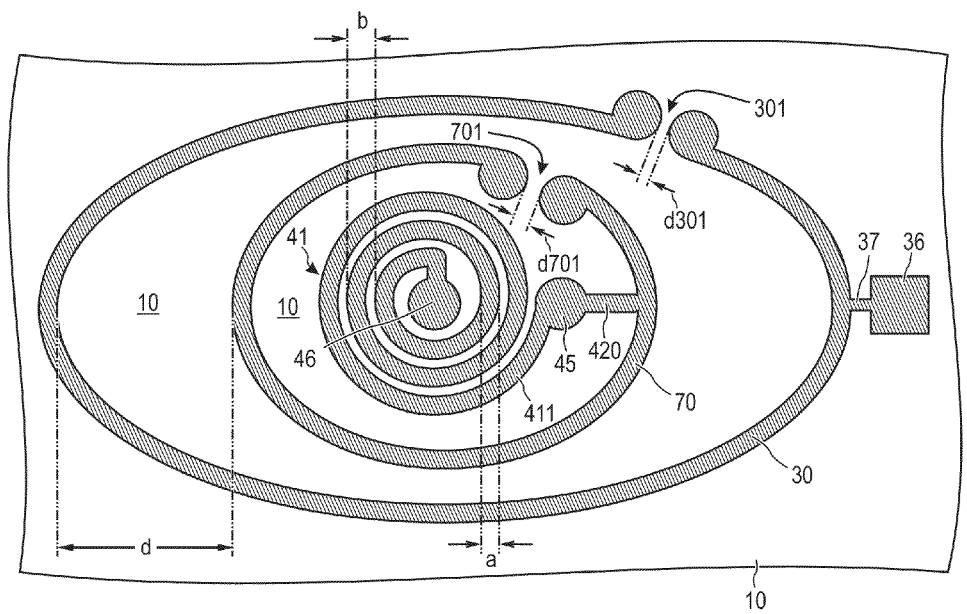
FIG. 7 is a cross-sectional view of a section of a semiconductor component that has a coreless transformer in which a single transmitter coil is surrounded by electrically conductive first and second rings each having an opening.

In the following detailed description, reference is made to the accompanying drawings, which form a part thereof, and in which is shown by way of illustration specific embodiments in which the invention may be practiced. In this regard, directional terminology, such as "top," "bottom," "front," "back," "leading," "trailing," etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Referring now to FIGS. 1 to 4 there is illustrated a semiconductor component 1 that has a coreless transformer which is monolithically integrated in a semiconductor body 10. For the sake of clarity, parts of the semiconductor component 1 that do not directly concern the coreless transformer are omitted. FIG. 2 shows a section of the semiconductor component 1 in a sectional plane that runs parallel to the vertical direction v. FIGS. 3 and 4 show cross-sections in sectional planes E1-E1 and E2-E2, respectively, marked in FIG. 2.

The vertical direction v runs perpendicular to a top side 11 and to a bottom side 12 of the semiconductor body 10. In this connection, the top side 11 and the bottom side 12 are regarded as substantially planar. Schematically illustrated in FIG. 2 is the border line of the semiconductor component 1. The semiconductor body 10 of the semiconductor component 1 may be formed from an arbitrary semiconductor material like silicon, germanium, silicon carbide, gallium arsenide, etc., and may include p-doped semiconductor regions, n-doped semiconductor regions, dielectric layers like silicon oxide e layers, nitride layers or imide layers, and electrically conductive layers and areas made of metal and/or polycrystalline semiconductor material. Optionally, the semiconductor component 1 may include, in addition to the coreless transformer, one or any combination of active semiconductor devices like IGBTs (insulated gate bipolar transistor), MOSFETs (metal oxide semiconductor field effect transistors), J-FETs (junction field effect transistors), thyristors, diodes. Alternatively or in addition, the semiconductor component 1 may include one or any combination of passive devices like resistors, capacitors, inductivities, etc. In particular, such devices can be controllable semiconductor devices that have a control electrode like a gate or a basis.

As can be seen from FIGS. 1 and 2, the coreless transformer has coils 41, 42, 51, 52, 61, 62. The coil 41 has spiralring-shaped windings 411, 412 and 413. Accordingly, the coil 42 has spiralring-shaped windings 421, 422 and 423, the coil 51 has spiralring-shaped windings 511, 512 and 513, the coil 52 has spiralring-shaped windings 521, 522 and 523, the coil 61 has spiralring-shaped windings 611, 612 and 613, and the coil 62 has spiralring-shaped windings 621, 622 and 623. The coils 41, 51, 61 have a common coil axis 91, the coils 42, 52, 62 a common coil axis 92. Both coil axes 91 and 92 run parallel to the vertical direction v.

At least one of the coils 41, 42, 51, 52, 61, 62 may be directly (i.e., only via a continuous, permanently electrically conductive connection) or indirectly (i.e., via active and/or passive elements, for instance a driver circuit for driving the controllable semiconductor device) electrically connected to a control electrode of a controllable semiconductor device.

Generally, a coreless transformer requires at least two coils. One coil that operates as a transmitter and another one that operates as a receiver. In the embodiment of FIGS. 1 to 4 there are two transmitter coils 41, 42 and four receiver coils 51, 52, 61, 62. The semiconductor component 1 may have contact terminals 45, 46, 47, for instance bond pads or solder pads. The transmitter coil 41 is electrically connected between the contact terminals 45 and 46, the transmitter coil 42 between the contact terminals 45 and 47. For one or both of the transmitter coils 41 and 42, one or both contact terminals 45, 46 and 45, 47 of the respective coil 41, 42 are surrounded by a closed, electrically conductive first ring 30. In the present invention, the first ring 30 is also referred to as "shield ring". The first ring 30 also surrounds the upper coils 41, 42, that is, the coils that are arranged closest to the top side 11.

In order to achieve a good shielding effect, the first ring 30 may be electrically connected, for instance via a bottom metal layer 500, to a defined electrical potential, e.g., ground potential (GND). The respective electrical connection may be realized via one or more electrically conductive columns 38 that extend towards the metal layer 500. In FIG. 1, the metal layer 500 is not shown. Instead of or in addition to the one or more electrically conductive columns 38, GND potential may be provided to the shield ring 30 via an optional bond pad 36 that is accessible from outside the semiconductor component 1. The bond pad 36 is connected to the first ring 30 via a conductor line 37.

As can be seen from FIG. 2, each column 38 may be formed from one segment of from more stacked segments 381, 382, 383. As the maximum length (to be measured in the vertical direction v) of a single segment 381, 382, 383 is limited by the used production technology, the number of the single segments 381, 382, 383 that forms a column 38 depends, in particular, on the manufacturing technology and on the thickness of the semiconductor body 10.

In case of two or more stacked segments 381 per column 38, the semiconductor component 1 may be produced by subsequently forming stacked semiconductor sub-layers 101, 102, 103 each including one segment 381 of each of the columns 38. As can be seen from FIG. 2, on top of such a sub-layer 101, 102, a mask layer 121, 122, 123, for instance of silicon nitride (SiN) or another suitable material, may remain in the completed component 1. The structured mask layers 121, 122, 123 allow for the etching of trenches in the sub-layer 101 and 102, respectively, underneath. After etching, the segments 381, 382, 383 of the respective sub-layers 101, 102 and 103, respectively, are produced by filling the trenches with electrically conductive material like metal (e.g., aluminum or copper) or polycrystalline semiconductor material.

Due to inductive coupling, a current signal supplied to a transmitter coil 41 or 42 via the respective contact terminals 45, 46 and 45, 47 causes an electric current in the subjacent receiver coils 51, 61 and 52, 62, respectively, which are galvanically isolated from the respective transmitter coils 41, 42. During operation of the semiconductor device 1, the absolute value of the difference between the electric potentials of a receiver coil 51, 52, 61, 62 and GND does usually not exceed some volts or some ten volts, whereas the difference between the electric potentials of a transmitter coil 41, 42 and GND may exceed some hundred volts, some thousand volts or even some ten thousand volts. Hence, the difference between the electric potentials of a transmitter coil 41, 42 and the shield ring 30 may also exceed some hundred volts, some thousand volts or even some ten thousand volts.

In order to further improve the shielding effect of the first ring 30, a number of optional, electrically conductive columns 39 are spaced distant from one another along the first ring 30. Each of the columns 39 runs substantially parallel to the vertical direction v and extends from the first ring 30 towards the bottom side 12. At their sides facing away from the bottom side 12, the electrically conductive columns 39 are electrically connected to the first ring 30.

In conventional arrangements, most of the electrical breakdowns occur at or close to the top side 11 of the semiconductor component 1 between the first ring 30 and the coils 41, 42 next to the first ring 30. In order to avoid such break downs, an electrically conductive second ring 70 is arranged between the coils 41, 42 and the first ring 30 and electrically connected to the coils 41, 42 via a conductor line 420. In the example of FIGS. 1 to 4, the conductor line 420 is directly connected to the contact terminal 45. However, the conductor line 420 could also be directly connected to an outermost winding 411 or 421 of the transmitter coils 41 and 42, respectively. The second ring 70 is neither electrically connected in series with the coil 41 between the contact terminals 45 and 46 nor with the coil 42 between the contact terminals 45 and 47.

The second ring 70 is only required to have substantially the same electric potential as the coils 41, 42 but not to carry significant electric currents. Therefore, the second ring 70 may be made not only of metal like copper or aluminum but alternatively of polycrystalline semiconductor material. In general, any electrically conductive material or combination of materials may be used for the second ring 70.

Optionally, the surface of the second ring 70 is, in a cross-sectional plane that runs perpendicular to the running direction r70 of the second ring 70, rounded at least in its sections facing towards the first ring 30, that is, in its sections 710 facing away from the respective coil axis 91 and 92, respectively, and/or in its sections facing towards the top side 11. As in contrast the windings 411, 412, 413, 421, 422, 423 of the coils 41 and 42 may have, in the same cross-sectional plane, straight side walls, the distances between adjacent windings 411, 412, 413 and 421, 422, 423 of each coil 41 and 42, respectively, may be very low. That is, the space for the coils 41, 42 can be used efficiently and a large number of windings can be provided with the effect that the coils 41, 42 produce strong electromagnetic signals. Hence, a coreless transformer according to the present invention may be operated without damage even if the absolute value of the potential difference between the first ring 30 and one of the coils 41, 42 exceeds (1 kV/20 μm) times the distance d between the first ring 30 and the second ring 70. For instance, the absolute value of the potential difference may be at least, 6 kV, at least 10 kV or even at least 20 kV. Thereby, the pitch (repeat distance) b (see FIGS. 2 and 3) between two adjacent windings 411/412, 412/413, 421/422, 422/423 of the same coil 41, 42 may be less than 55 μm, for instance in the range from 0.3 μm to 55 μm. The width a of the windings 411, 412, 413, 421, 422, 423 may be, for instance, in the range from 0.1 μm to 40 μm with the secondary condition that a<b.

A second ring 70 that has, in a cross-sectional plane perpendicular to its running direction, a rounded surface which may be produced by forming a ring-shaped trench that has straight side walls in the dielectric layer 15, and by subsequently wet etching the trench. The dielectric layer 15 has a peculiar structure such that it can be etched, in combination with a certain etchant, with an anisotropic etch rate. If the dielectric layer 15 is, for instance, a silicon oxide based layer, such an anisotropic etching behavior can be achieved by doping the silicon oxide with phosphorus (P) such that the P-dopant concentration is not constant in the vertical direction v. As the P-dopant concentration rises, the higher the etch rate with which material of the layer 15 is etched off perpendicular to the vertical direction v and perpendicular to the running direction of the trench. If the run of P-dopant concentration is appropriately adjusted, the etched trench has a cross-section with rounded side walls. After etching, the second ring 70 is formed by filling the trench with electrically conductive material like metal (e.g., copper or aluminum) or polycrystalline semiconductor material. Instead of doped silicon, any other dielectric material may also be used for the dielectric layer 15.

According to a further embodiment illustrated in FIGS. 5 and 6, not only the second ring 70 but also the first ring 30 may be, in a cross-sectional plane that runs perpendicular to its running direction r30, rounded at least in its sections 310 facing towards the second ring 70, and/or in its sections facing towards the top side 11. A first ring 30 having in cross-section at least a partly rounded surface may be produced with the same method as described above with reference to FIGS. 1 to 4.

In the above-explained embodiments, two transmitter coils 41 and 42 are electrically connected to one another. However, as exemplarily illustrated in FIGS. 7 and 8, also a single transmitter coil 41 can be surrounded by an electrically conductive first ring 30 and an electrically conductive second ring 70 arranged between the transmitter coil 41 and the electrically conductive first ring 30. The first and second rings 30, 70 may have the same structure as the first and second rings 30, 70 explained above with reference to FIGS. 1 to 6. The sole difference is that each of the first and second rings 30, 70 is formed as an open ring because otherwise the current through the coil 41 would cause through induction, electric currents in the rings 30, 70 which would adversely affect the magnetic field produced by the coil 41 and the efficiency of the coreless transformer. Nevertheless, the first and/or second rings 30, 70 may also be formed as closed rings. If desired in this case, the adverse effect may be reduced by avoiding low-ohmic materials for the rings 30 and/or 70.

In the arrangement of FIG. 7, the first ring 30 has an opening 301, the second ring 70 an opening 701. Both openings 301, 701 are small. For instance, the opening 301 may have a width d301 which is less than or equal to 10 μm, e.g., in the range from 90 nm to 10 μm. Accordingly, the opening 701 may have a width d701 which is less than or equal to 10 μm, e.g. in the range from 90 nm to 10 μm.

Optionally, in the same sectional plane, the ends of the first ring 30 may be rounded outwardly, i.e., away from the coil 41, and the ends of the second ring 70 may be rounded inwardly, i.e., towards the coil 41.

Figure 8:
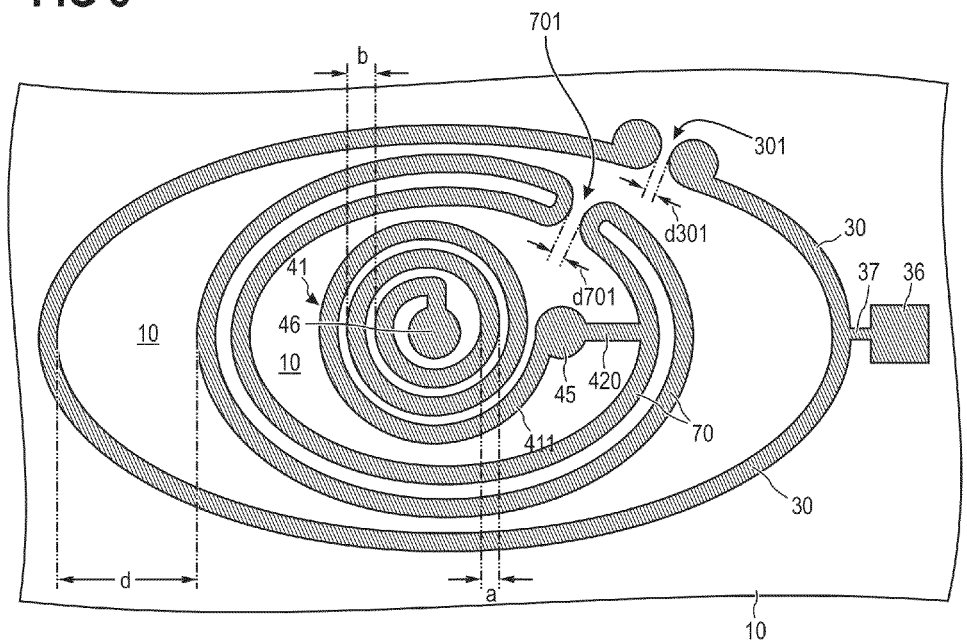
FIG. 8 is a cross-sectional view of a section of a further embodiment of a semiconductor component that has a coreless transformer in which the second ring is formed from a ring-shaped closed conductor line.

A further embodiment that is illustrated in FIG. 8 differs from the embodiment explained with reference to FIG. 7 only in that the second ring 70 is formed as a closed ring conductor that has an opening 301.

Figure 9:
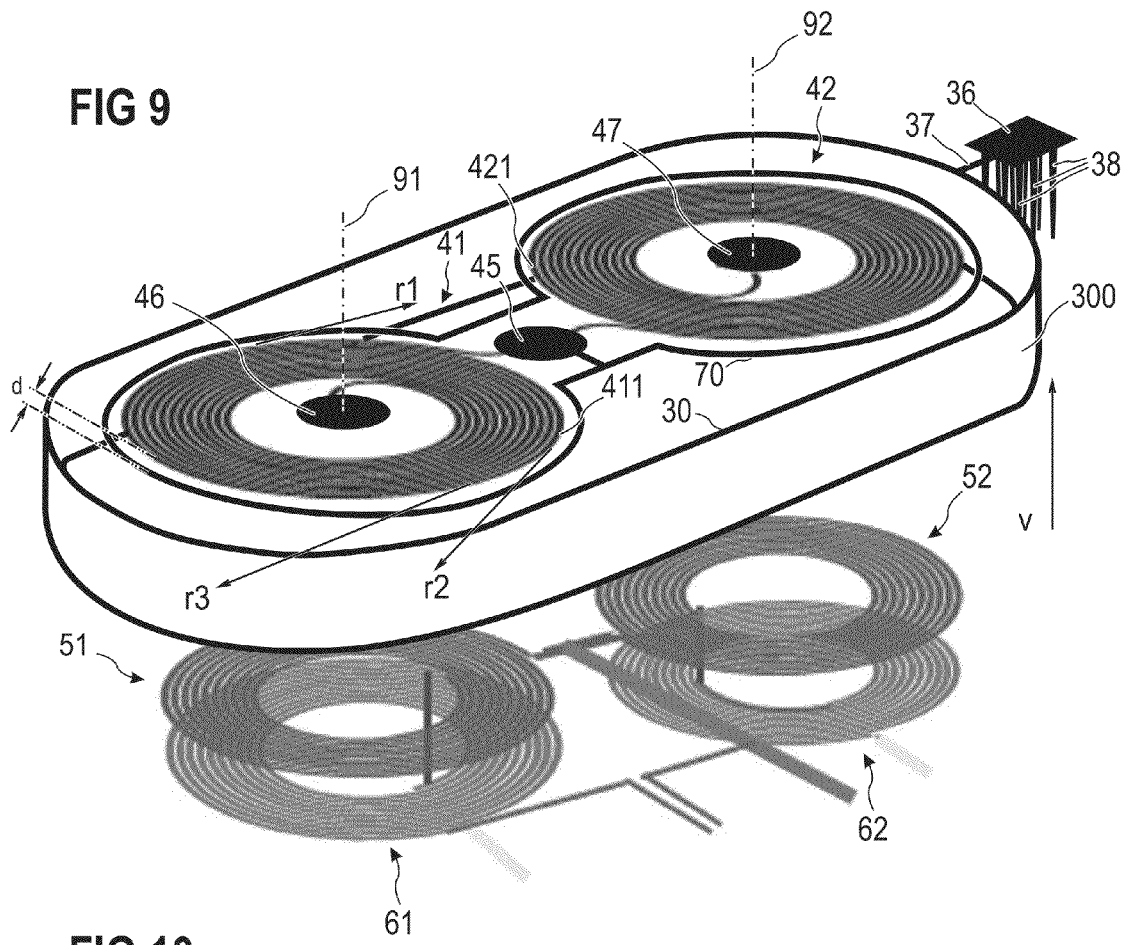
FIG. 9 is a perspective view of coreless transformer coils of a semiconductor component in which the first ring is a closed wall.

In still a further embodiment illustrated in FIG. 9, a first ring 30 may be formed as a closed, electrically conductive ring wall 300. Compared to the columns 39 of the arrangement of FIGS. 1 to 4, such a closed ring wall 300 protects the coreless transformer against the infiltration of humidity. Optionally, the closed ring wall 300 may extend towards the bottom side 12 at least as far as the level of the metal layer in which the coils 51 and 52 are formed.

In the embodiments explained above the first ring 30 and the second ring 70 surround one or two transmitter coils 41, 42. However, the first ring 30 and the second ring 70 may also surround one or more receiver coils 51, 52, 61, 62 in the same manner.

Figure 10:
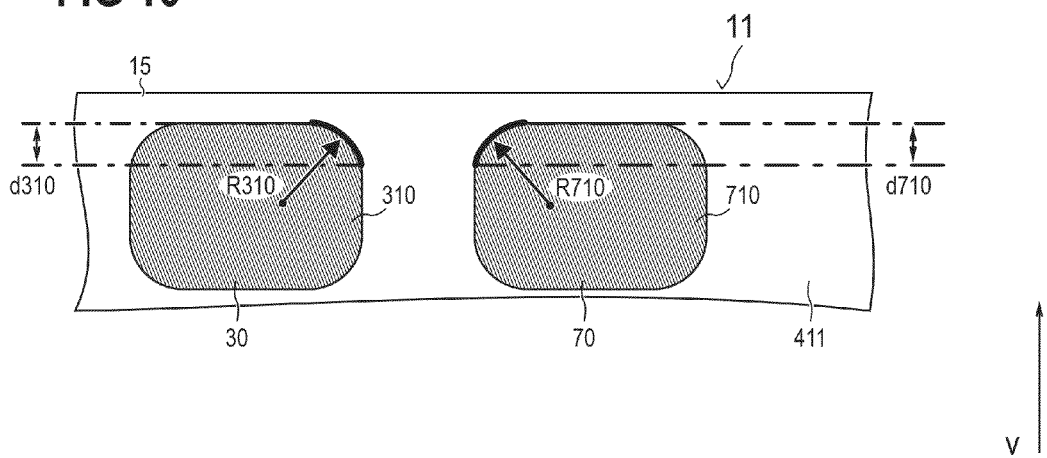
FIG. 10 illustrates possible curvatures of the first and second rings.

FIG. 10 is an enlarged view of a section of the semiconductor component of FIG. 6 in order to illustrate certain features of possible curvatures of the first ring 30 and/or the second ring 70. The first ring 30 has a continuous first surface section 310 which is, in a cross-sectional plane (the drawing plane) perpendicular to the running direction (perpendicular to the drawing plane) of the first ring 30, arranged on that side of the first ring 30 that faces towards the second ring 70. The first surface section 310 has, in that cross-sectional plane, a radius of curvature R310 of at least 0.4 μm. For instance, the continuous first surface section 310 may everywhere have a radius R310 of curvature of at least 0.4 μm, and, optionally, of less than or equal to 3.2 μm, e.g. about 2 μm. In the vertical direction v, the first surface section 310 may extend over a distance d310 of at least 100 nm or of at least 0.8 μm.

Accordingly, the second ring 70 has a continuous second surface section 710 which is, in a cross-sectional plane (the drawing plane) perpendicular to the running direction (perpendicular to the drawing plane) of the second ring 70, arranged on that side of the second ring 70 that faces towards the first ring 30. The second surface section 710 has, in that cross-sectional plane, everywhere a radius of curvature R710 of at least 0.4 μm. For instance, the continuous second surface section 710 may everywhere have a radius R710 of curvature in the range from 0.4 μm to 3.2 μm, e.g., about 2 μm. In the vertical direction v, the continuous second surface section 710 may extend over a distance d710 of at least 100 nm or of at least 0.8 μm.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc., and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a" "an" and "the" are intended to include the plural as well as the singular, unless the context clearly indicates otherwise.

Although present embodiments and its advantages have been described in detail, it should be understood that various changes, substitutions and alterations can be made herein without departing from the spirit and the scope of the invention as defined by the appended claims. In particular, different features of different embodiments may be combined unless mentioned otherwise. With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor component with a coreless transformer, the coreless transformer comprising:
   a first connection contact;
   a second connection contact;
   an electrically conductive spiral first coil that is electrically connected between the first connection contact and the second connection contact;
   an electrically conductive first ring surrounding the first coil and one or both of the first connection contact and the second connection contact; and
   an electrically conductive second ring arranged between the first coil and the first ring, the second ring electrically connected to the first coil and surrounding the first coil and one or both of the first connection contact and the second connection contact.

2. The semiconductor component as claimed in claim 1, wherein the coreless transformer further comprises:
   a third connection contact;
   an electrically conductive spiral second coil electrically connected between the first connection contact and the third connection contact;
   the first ring surrounding the second coil and one or both of the first connection contact and the third connection contact; and
   the second ring arranged between the second coil and the first ring and surrounding the second coil and one or both of the first connection contact and the third connection contact.

3. The semiconductor component as claimed in claim 1, wherein the first ring comprises a continuous first surface section which is, in a cross-sectional plane perpendicular to a running direction of the first ring, arranged on a side of the first ring that faces towards the second ring, wherein the continuous first surface section comprises, in the cross-sectional plane, a radius of curvature of at least 0.4 µm for the entire continuous first surface section.

4. The semiconductor component as claimed in claim 3, wherein the continuous first surface section has, in the cross-sectional plane, a radius of curvature in a range from 0.4 µm to 3.2 µm throughout the continuous first surface section.

5. The semiconductor component as claimed in claim 3, wherein the continuous first surface section extends, in a vertical direction, over a distance of at least 100 nm or of at least 0.8 µm.

6. The semiconductor component as claimed in claim 1, wherein the second ring comprises a continuous second surface section which is, in a cross-sectional plane perpendicular to a running direction of the second ring, arranged on a side of the second ring facing towards the first ring, wherein the continuous second surface section has, in the cross-sectional plane, a radius of curvature of at least 0.4 µm throughout the continuous second surface section.

7. The semiconductor component as claimed in claim 6, wherein the continuous second surface section has, in the cross-sectional plane, a radius of curvature of less than 3.2 µm throughout the continuous second surface section.

8. The semiconductor component as claimed in claim 6, wherein the continuous second surface section extends, in a vertical direction, over a distance of at least 100 nm or of at least 0.8 µm.

9. The semiconductor component as claimed in claim 1, wherein the second ring is not electrically connected in series with the first coil between the first connection contact and the second connection contact.

10. The semiconductor component as claimed in claim 1, wherein the first ring is an open or a closed ring.

11. The semiconductor component as claimed in claim 10, wherein
    the first ring is an open ring comprising a first opening; and
    the first opening has a first width of less than or equal to 10 µm.

12. The semiconductor component as claimed in claim 10, wherein the first ring comprises a first opening disposed between two ends of the first ring, wherein each of the two ends is curved away from the first coil.

13. The semiconductor component as claimed in claim 1, wherein the second ring is an open or a closed ring.

14. The semiconductor component as claimed in claim 13, wherein
    the second ring is an open ring comprising a second opening; and
    the second opening has a second width of less than or equal to 10 µm.

15. The semiconductor component as claimed in claim 13, wherein the second ring comprises a second opening disposed between two ends of the second ring, wherein each of the two ends of the second ring is curved towards the first coil.

16. The semiconductor component as claimed in claim 1, wherein a distance between two adjacent windings of the first coil is less than 55 µm.

17. The semiconductor component as claimed in claim 1, wherein the first ring comprises a closed electrically conductive ring wall.

18. The semiconductor component as claimed in claim 1, wherein the first ring is electrically isolated from the second ring.

19. The semiconductor component as claimed in claim 1, wherein the second ring and the first coil are disposed at a same metallization level.

20. A method for operating a semiconductor component, the method comprising:
    providing a semiconductor component with a coreless transformer, the coreless transformer comprising:
       a first connection contact;
       a second connection contact;
       an electrically conductive spiral first coil that is electrically connected between the first connection contact and the second connection contact;
       an electrically conductive first ring surrounding the first coil and one or both of the first connection contact and the second connection contact;
       an electrically conductive second ring arranged between the first coil and the first ring, the second ring electrically connected to the first coil and surrounding the first coil and one or both of the first connection contact and the second connection contact; and applying a potential difference that has an absolute value of at least (1 kV/20 μm) times a distance between the first ring and the second ring.

21. The method as claimed in claim 20, wherein the coreless transformer further comprises:
a third connection contact;
an electrically conductive spiral second coil that is electrically connected between the first connection contact and the third connection contact;
the first ring surrounding the second coil and one or both of the first connection contact and the third connection contact; and
the second ring arranged between the second coil and the first ring and surrounding the second coil and one or both of the first connection contact and the third connection contact.

22. The method as claimed in claim 20, wherein the first ring comprises a continuous first surface section which is, in a cross-sectional plane perpendicular to a running direction of the first ring, arranged on a side of the first ring that faces towards the second ring, wherein the continuous first surface section has, in the cross-sectional plane, a radius of curvature of at least 0.4 μm throughout the continuous first surface section.

23. The method as claimed in claim 22, wherein the continuous first surface section has, in the cross-sectional plane, a radius of curvature in a range from 0.4 μm to 3.2 μm throughout the continuous first surface section.

24. The method as claimed in claim 22, wherein the continuous first surface section extends, in a vertical direction, over a distance of at least 100 nm or of at least 6 μm.

25. The method as claimed in claim 20, wherein the second ring comprises a continuous second surface section which is, in a cross-sectional plane perpendicular to a running direction of the second ring, arranged on a side of the second ring facing towards the first ring, wherein the continuous second surface section has, in the cross-sectional plane, a radius of curvature of at least 0.4 μm throughout the continuous second surface section.

26. The method as claimed in claim 25, wherein the continuous second surface section has, in the cross-sectional plane, a radius of curvature in a range from 0.4 μm to 3.2 μm throughout the continuous second surface section.

27. The method as claimed in claim 25, wherein the continuous second surface section extends, in a vertical direction, over a distance of at least 100 nm or of at least 6 μm.

28. The method as claimed in claim 20, wherein the second ring is not electrically connected in series with the first coil between the first connection contact and the second connection contact.

29. A semiconductor component with a coreless transformer, the coreless transformer comprising:
a first connection contact;
a second connection contact;
an electrically conductive spiral first coil that is electrically connected between the first connection contact and the second connection contact;
an electrically conductive first ring surrounding the first coil and one or both of the first connection contact and the second connection contact; and
an electrically conductive second ring arranged between the first coil and the first ring, the second ring electrically connected to the first coil and surrounding the first coil and one or both of the first connection contact and the second connection contact, wherein the first ring comprises a continuous surface section which, in a cross-sectional plane perpendicular to a running direction of the first ring, is arranged on a side of the first ring that faces towards the second ring.

30. The semiconductor component as claimed in claim 29, wherein the continuous surface section comprises, in the cross-sectional plane, a radius of curvature of at least 0.4 μm for the entire continuous surface section.

* * * * *